(12) United States Patent
Lu et al.

(10) Patent No.: US 9,852,251 B2
(45) Date of Patent: Dec. 26, 2017

(54) MANIPULATING PARAMETERIZED CELL DEVICES IN A CUSTOM LAYOUT DESIGN

(71) Applicants: Synopsys, Inc., Mountain View, CA (US); Synopsys Taiwan Co., Ltd., Taipei (TW)

(72) Inventors: Hsiao-Tzu Lu, Hsinchu (TW); Duncan Robert McDonald, Redwood City, CA (US); Chih-Wei Yuan, San Jose, CA (US); Wen-Lung Kang, Cupertino, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/203,300

(22) Filed: Mar. 10, 2014

(65) Prior Publication Data

US 2014/0304671 A1 Oct. 9, 2014

Related U.S. Application Data

(63) Continuation of application No. 13/514,068, filed on Jun. 6, 2011, now Pat. No. 8,707,226.

(60) Provisional application No. 61/353,946, filed on Jun. 11, 2010.

(51) Int. Cl.
*G06F 17/50* (2006.01)

(52) U.S. Cl.
CPC ...... *G06F 17/5072* (2013.01); *G06F 17/5068* (2013.01)

(58) Field of Classification Search
USPC .......................................... 716/110
See application file for complete search history.

(56) References Cited

U.S. PATENT DOCUMENTS

| | | | |
|---|---|---|---|
| 7,546,556 B1 * | 6/2009 | Wagner | 716/110 |
| 2007/0118825 A1 * | 5/2007 | Gaul | 716/10 |
| 2011/0307854 A1 | 12/2011 | Lu et al. | |

OTHER PUBLICATIONS

"Laker Custom Layout System," Laker Custom IC Design Solutions, SpringSoft, 6 pages (2008).
Petrus, "OpenACcess PCell Interoperability," CiraNova Inc., pp. 1-13 (2005).

(Continued)

*Primary Examiner* — Eric Lee
(74) *Attorney, Agent, or Firm* — Alston & Bird LLP

(57) ABSTRACT

A system, apparatus and computer-implemented method for manipulating a parameterized cell device into a custom layout design. The method begins by receiving at least one parameterized cell representing a physical circuit from, for example, a database or configuration file. The parameterized cell has a plurality of configurable attributes. The method continues by adjusting one of the configurable attributes of the parameterized cell according to a capability associated with the one attribute. The attributes may include one or more of a parameter mapping capability, a port mapping capability, an abutment capability, a directional extension capability, a channel width capability, and a boundary layer capability. The method then calculates a new configuration for the parameterized cell based upon the adjustment, and applies the new configuration for the parameterized cell to a layout of the represented physical circuit.

21 Claims, 14 Drawing Sheets

(56) References Cited

OTHER PUBLICATIONS

Quan, "Accelerating Innovation Through Interoperable PDK," Taiwan Semiconductor Manufacturing Company Limited, pp. 1-10 (2008).
Non-Final Office Action for U.S. Appl. No. 13/154,068 dated May 23, 2012, 17 pages.
Final Office Action for U.S. Appl. No. 13/154,068 dated Oct. 10, 2012, 17 pages.
Non-Final Office Action for U.S. Appl. No. 13/154,068 dated Jun. 21, 2013, 10 pages.
Notice of Allowance for U.S. Appl. No. 13/154,068 dated Dec. 2, 2013, 10 pages.

* cited by examiner

| SDC/MDC | | | | | | | | DEVICE | | | | | | | SCALE | | | | | | |
|---|---|---|---|---|---|---|---|---|---|---|---|---|---|---|---|---|---|---|---|---|---|
| W | WF | L | NF | LOD_EXT | ROD_EXT | SD_SWAP | = | WTOT | WF | LEN | FINGER | L_STRE | R_STRE | SD_SWAP | × | 1E6 | 1E6 | 1E6 | 1 | 1E6 | 1E6 | N/A |

*FIG. 5B*

| SDC/MDC | | | | | DEVICE | | | |
|---|---|---|---|---|---|---|---|---|
| PORT "D" | PORT "G" | PORT "S" | PORT "B" | = | PORT "A" | PORT "B" | PORT "C" | PORT "D" |

*FIG. 6*

[MODEL_MAP]
X n_4t          reference90rf     {n_4t layout}
X p_4t          reference90rf     {p_4t layout}
X cmin_2t       reference90rf     {cmin_2t layout}
X mpoly         reference90rf     {mpoly layout}

[DEVICE_NOS]
{n_4t layout} NMOS {(W wtot 1e6) (WF w 1e6} {L l 1e6} (NF nf) {LODExt diffL_ext 1e6} {RODExt diffR_ext 1e6}} (0.12 0.12) {diff 0.2}
{p_4t layout} PMOS {(W wtot 1e6) (WF w 1e6} {L l 1e6} (NF nf) {LODExt diffL_ext 1e6} {RODExt diffR_ext 1e6}} (0.12 0.12) {diff 0.2}

[DEVICE_CAP]
{cmin_2t layout} CAP {(W wcap 1e6} {L lcap 1e6}} {0.5 0.5} {cmin 0.2}

[DEVICE_RES]
{mpoly layout} RES {(W wr 1e6) {L lr 1e6}} {0.2 0.2} {poly 0.2}

MANIPULATING PARAMETERIZED CELL DEVICES IN A CUSTOM LAYOUT DESIGN

FIELD OF THE INVENTION

The present disclosure relates to systems, apparatus and methods in the field of electronic design automation and, more particularly, for improved apparatus, systems and methods of manipulating parameterized cell devices in a custom layout design.

BACKGROUND OF THE INVENTION

Electronic design automation (EDA) is a general term used to describe computer-based design tools that assist an engineer or designer in their design tasks. EDA tools are especially useful in the integrated circuit (IC) design field. The improvement of EDA tools for IC design work has enabled a corresponding increase in speed to market for electronic products and facilitated a greater level of sophisticated interoperability between systems used by disparate designers and manufacturers.

EDA tools often involve circuit schematic capture, design verification and circuit layout for IC circuit design in the analog, digital, mixed signal, and custom circuit devices fields. With the layout aspect of EDA work, IC designers continue to strive towards more efficient use of a device's physical space. Manual and automated layout tools within conventional EDA tools commonly assist IC designers in this manner. When attempting to maximize circuit density within design rule constraints, IC designers often need to manipulate the layout of a device design, which can be onerous and introduce errors leading to performance issues or other design rule violations. Thus, particular attention is paid to layout within EDA tools.

Parameterized cells (PCells) provide an advanced level of EDA to help better address layout tasks faced by an IC designer. PCells are commonly known within the EDA and IC design fields to allow for changing the size, shape or contents of each cell instance, without changing the original cell. As such, similar to concepts of object-oriented programming, PCells introduce an improved level of abstraction to the component levels of IC design. This helps accelerate the layout task facing an IC designer and helps avoid or reduce design rule verification errors by simplifying complex shapes and devices that may be generated and edited within an EDA tool. However, there remains a need for an improved way to use and manipulate PCells within an EDA tool that results in an efficient and custom device layout design.

BRIEF SUMMARY OF THE INVENTION

In accordance with aspects of the present invention, a system, apparatus and computer-implemented method is provided for manipulating a parameterized cell device into a custom layout design. In one aspect, a method begins by receiving at least one parameterized cell representing a physical circuit from, for example, a database or configuration file. The parameterized cell has a plurality of configurable attributes. The method continues by adjusting one of the configurable attributes of the parameterized cell according to a capability associated with the one attribute. The attributes may include one or more of a parameter mapping capability, a port mapping capability, an abutment capability, a directional extension capability, a channel width capability, and a boundary layer capability. The method then calculates a new configuration for the parameterized cell based upon the adjustment, and applies the new configuration for the parameterized cell to a layout of the represented physical circuit.

In another aspect, a method is provided for manipulating a parameterized cell. The method begins by receiving a parameterized cell representing an instance of a physical circuit where the parameterized cell has a plurality of configurable attributes. The parameterized cell is displayed as one or more symbols on a display in an initial configuration. The method continues by manipulating at least one of the symbols to adjust one of the configurable attributes of the parameterized cell according to a capability associated with the one attribute, where the manipulated symbols forming a new configuration for the parameterized cell. The method then displays the new configuration for the parameterized cell on the display.

In yet another aspect, a method is provided for manipulating a parameterized cell that starts by receiving a layout representing an instance of a physical circuit and then converting the layout into one or more symbols associated with the parameterized cell, which has a plurality of configurable attributes. The method continues by displaying the parameterized cell as one or more symbols on a display, the symbols being in an initial configuration. Then, the method manipulates at least one of the symbols to adjust one of the configurable attributes of the parameterized cell according to a capability associated with the one attribute, the manipulated symbols forming a new configuration for the parameterized cell. The method displays the new configuration for the parameterized cell on the display and generates a new layout associated with the new configuration for the parameterized cell.

In a final aspect, an apparatus is described for manipulating a parameterized cell. The apparatus comprises a processor, a video display coupled to the processor, an input device coupled to the processor, and a memory storage coupled to the processor. The memory storage maintains, at least. a circuit schematic database, a device database associated with the parameterized cell, and a symbol placement editor software module. When the symbol placement editor software module is executed, the processor is further configured to read the parameterized cell from the device database, the parameterized cell representing an instance of a physical circuit; the parameterized cell having a plurality of configurable attributes. The processor can control the display of the parameterized cell as one or more symbols on the video display in an initial configuration. The processor can also adjust one of the configurable attributes of the parameterized cell according to a capability associated with the one attribute, the adjustment being in response to an input received by the input device, the manipulated symbols forming a new configuration for the parameterized cell. Further, the processor can control the display of the parameterized cell on the video display in the new configuration for the parameterized cell.

Additional advantages of this and other aspects of the invention will be set forth in part in the description which follows, and in part will be obvious from the description, or may be learned by practice of the invention. It is to be understood that both the foregoing general description and the following detailed description are exemplary and explanatory only and are not restrictive of the invention, as claimed. The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 5B is a diagram illustrating another example of a parameter mapping capability in accordance with an embodiment of the present invention.

FIG. 6 is a diagram illustrating a port mapping capability associated with the exemplary circuit of FIG. 2 in accordance with an embodiment of the present invention.

FIG. 9 is a listing representing the contents of an exemplary configuration file in accordance with an embodiment of the present invention.

DETAILED DESCRIPTION OF THE INVENTION

Figure 1:
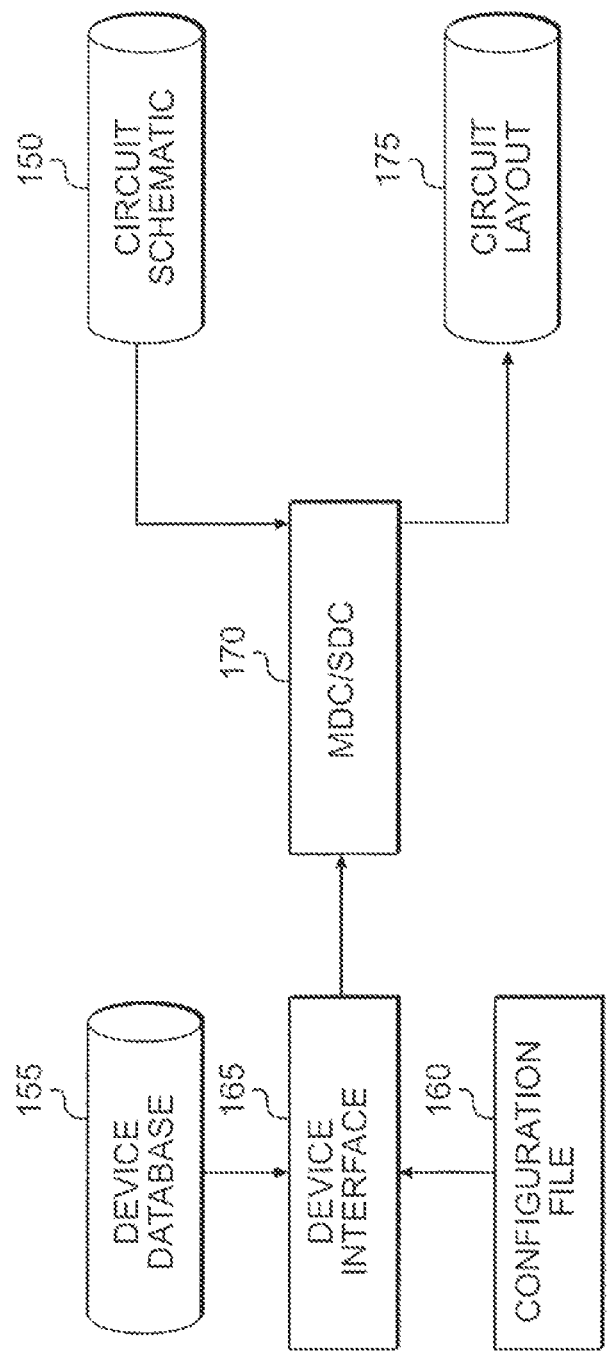
FIG. 1 is an exemplary device creation flow diagram in accordance with an embodiment of the present invention.

Reference will now be made in detail to exemplary embodiments. Wherever possible, the same reference numbers are used in the drawings and the description to refer to the same or like parts.

Figure 24:
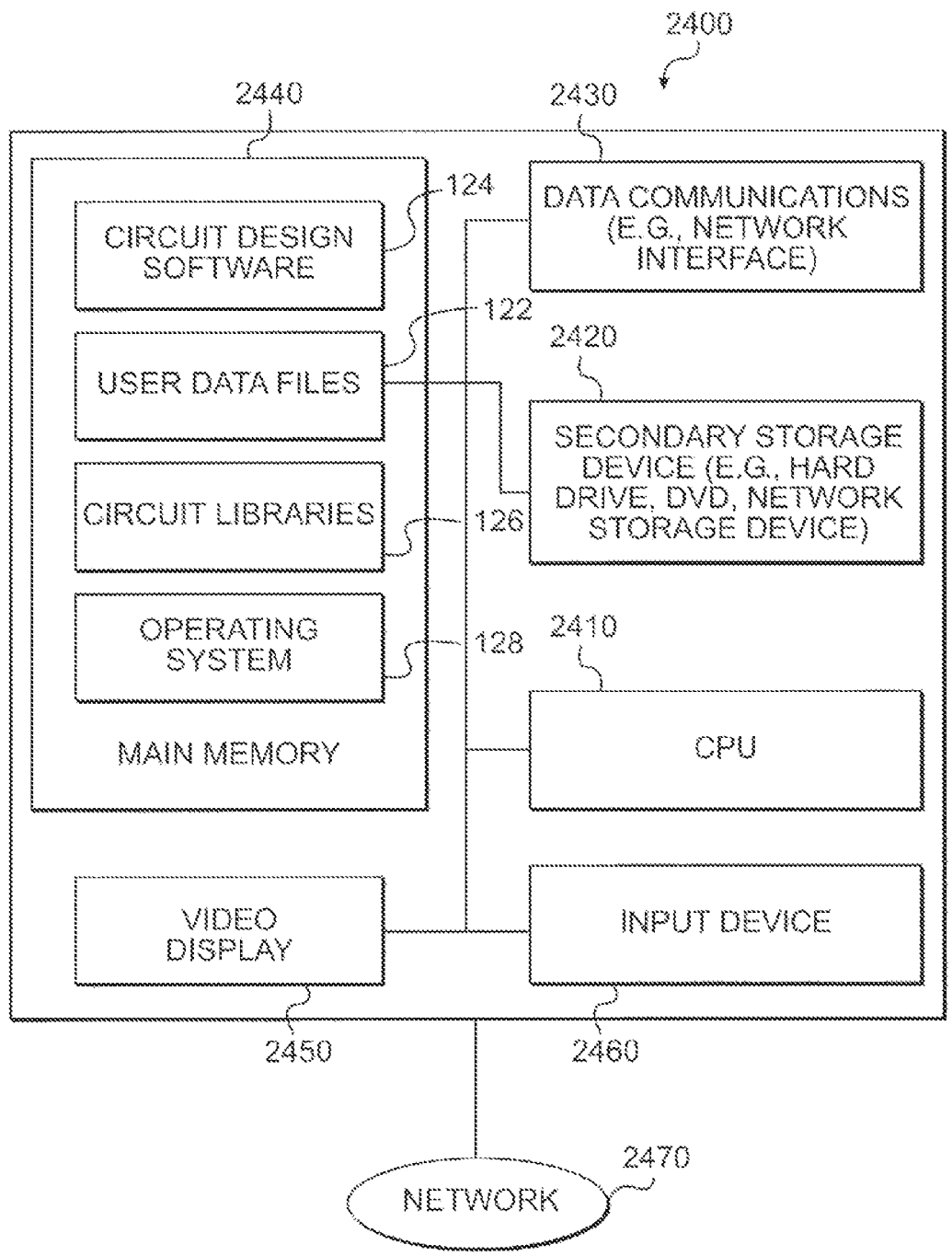
FIG. 24 is an exemplary computer-implemented operating environment for an embodiment of the present invention.

In general, embodiments of an apparatus and method for manipulating parameterized cells (PCells) in a custom layout design are described herein. FIG. 24 is a general diagram of a computer system on which the software modules and applications shown in FIG. 1 may execute. Exemplary apparatus, circuits, and systems used to help describe aspects of embodiments of the invention appear in FIGS. 2 and 17. The remaining Figures illustrate various aspects of how PCells may be advantageously manipulated in the context of exemplary circuits in accordance with principles of the present invention.

Referring first to FIG. 24, an exemplary computer-implemented operating environment is illustrated that is suitable for practicing methods and implementing an apparatus and systems consistent with principles and aspects of the present invention. Computer system 2400 of FIG. 24 is shown connected to a network 2470, such as a Local Area Network, Wide Area Network, or the Internet. Computer system 2400 contains a central processing unit (CPU) 2410, a memory storage device called main memory 2440 (e.g., RAM, ROM, or a combination of both), a secondary memory storage device 2420, an input device 2460 (e.g., a keyboard, mouse, tablet, touch pad interface, etc.), and a video display 2450, each of which are electronically coupled to the other parts of computer system 2400. Computer system 2400 also includes a data communications interface 2430, which is also electronically coupled to the other parts of the computer system 2400 and facilitates data communications with network 2470 and other computer systems (not shown) or network storage devices (not shown). In an exemplary embodiment consistent with the present invention, computer system 2400 may be implemented as a single general purpose computer. However, those skilled in the art will appreciate that computer system 2400 may also be implemented in a client/server configuration, a cloud computing configuration, or other multi-processor or massively parallel computing implementations that take advantage of alternative hardware and network architectures useful for EDA use.

Within computer system 2400, main memory 2440 contains an operating system 128, applications (such as circuit design software 124), software libraries (such as circuit libraries 126), and user data files (such as files 122 created using circuit design software 124 to represent a particular circuit or groups of circuits). Embodiments of the present invention may be implemented as computer software (such as applications, software libraries or user files) residing on computer-readable media, which when read and executed by a conventional computer, causes the computer to function as part of a system, such as an IC design and layout system, executing an improved method in accordance with the invention for manipulating parameterized cells in a custom layout design. Suitable computer-readable media includes, but is not limited to, main memory 2440 or secondary storage memory 2420 (e.g., hard drives, compact disks, floppy disks, magneto-optical disks, DVD media, network storage drives, flash memory device and other electronic articles having computer memory).

In the context of such an exemplary computer system, FIG. 1 illustrates an exemplary device creation flow diagram in terms of software modules within circuit design software 124/circuit libraries 128 and exemplary files stored as user data files 122 in accordance with an embodiment of the present invention. In one embodiment, these software modules (implemented as software 124, libraries 126 and/or user data files 126) include the following operationally-linked modules:

Circuit Schematic 150: A design circuit schematic database, which may be implemented as an OpenAccess (OA) compliant database facilitating interoperability between OA EDA vendor tools.

Device Database 155: A database for any parameterized device. Exemplary embodiments of such parameterized devices include, but are not limited to, a MCell™ (also referred to as a Magic Cell™), Tel PCell, PyCell™, UDD (user-defined devices), and/or other OA implementations of a PCell. The Device Database 155 may comprise a library of PCells as part of a process design kit (PDK).

Configuration File(s) 160: A file used to provide information regarding a PCell (e.g., PyCell, Tel PCell, UDD, etc.). Because some devices (especially OA PCells) are isolated modules that may not pass any information to a Device Interface (described below), this file is used to help the Device Interface to understand particular PCells beyond that or in addition to what is stored in the Device Database.

Device Interface 165: A software interface module between features (e.g., floor planning and MDC/SDC) and device related information (such as information stored in the Device Database 155 and Configuration Files 160). The Device Interface 165 provides programmatic access to the device related stored information and helps the other features of circuit design software 124 (such as MDC/SDC 170 or Circuit Layout 175) understand device behavior when editing the design and creating proper circuit layouts.

MDC/SDC 170: A symbol placement editor software tool using a match device creator (MDC) and/or a stick diagram compiler (SDC).

Circuit Layout 175: A layout database. In one embodiment, the Circuit Layout 175 may be implemented with an OA compliant Laker™ Custom Layout System from SpringSoft, Inc.

Figure 2:
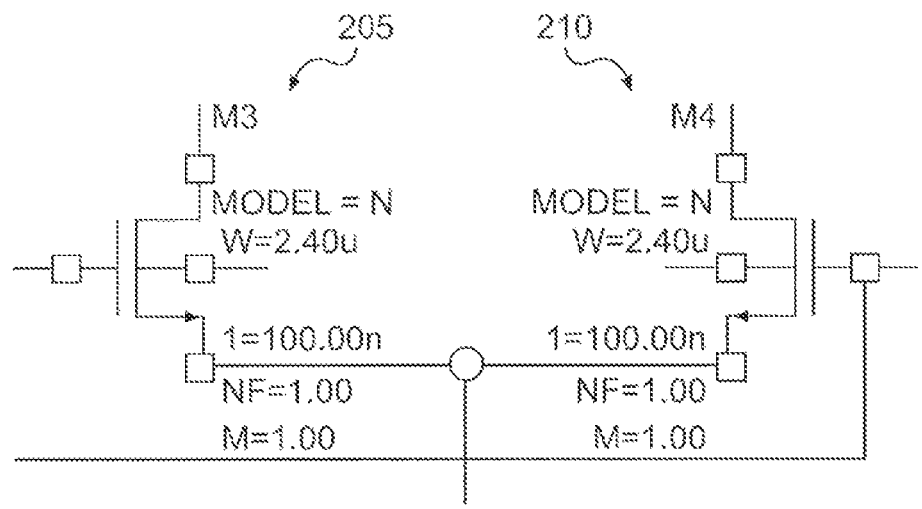
FIG. 2 is a schematic diagram of an exemplary circuit.

In the context of the above referenced computer hardware (FIG. 24) and software operating environment (FIG. 1), several examples will be described in accordance with embodiments and principles of the present invention. FIG. 2 provides a schematic diagram of an exemplary circuit 200 having a differential pair of transistors M3 and M4. As shown in FIG. 2, transistors M3 (element 205) and M4 (element 210) are graphically depicted connected and coupled in a differential configuration. One skilled in the art will appreciate that the accompanying text shown for each transistor in FIG. 2's schematic diagram provides information for each of the respective elements and will depend upon the particular schematic entry tool and databases used as part of the EDA system.

Figure 3:
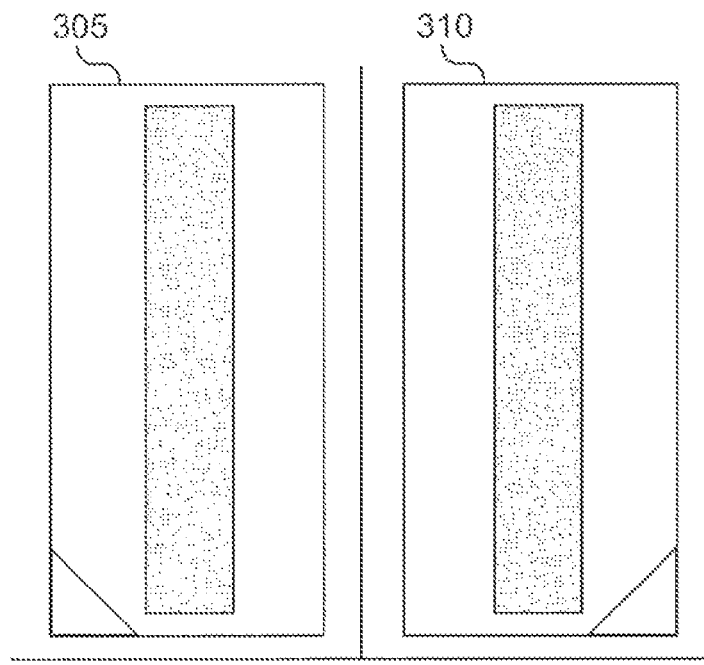
FIG. 3 is a diagramatic instance of an exemplary PCell associated with the exemplary circuit of FIG. 2.

In an embodiment using MDC, the PCell associated with the exemplary differential pair of FIG. 2 is treated as an instance and the result in MDC is illustrated in FIG. 3 as two symbols 305, 310. The realized layout result of the exemplary differential pair of FIG. 2 is illustrated in FIG. 4 as two layout structures 405 and 410.

Figure 7:
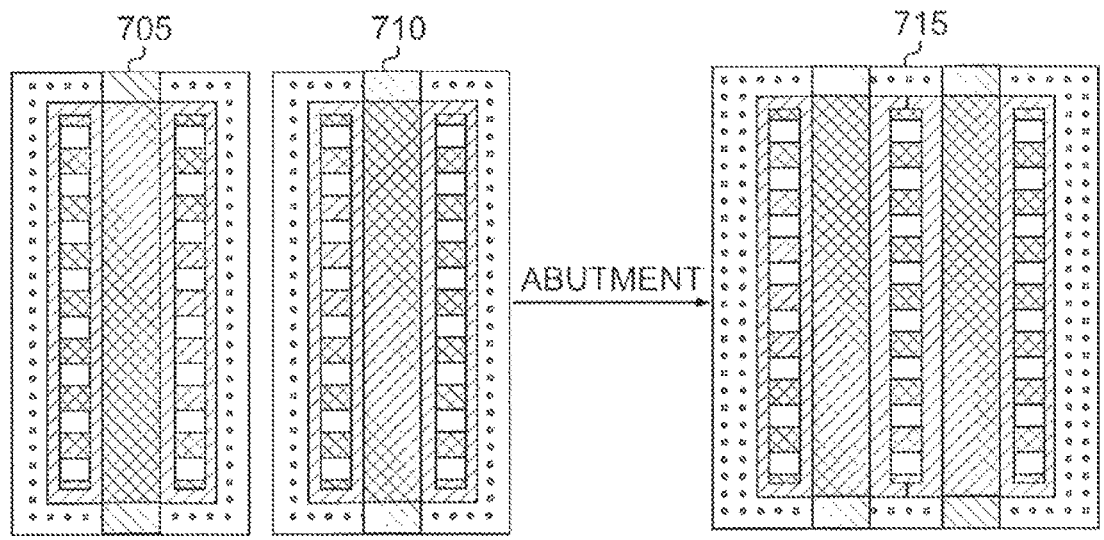
FIG. 7 is a diagram illustrating an abutment capability associated with the exemplary circuit of FIG. 2 in accordance with an embodiment of the present invention.
Figure 8:
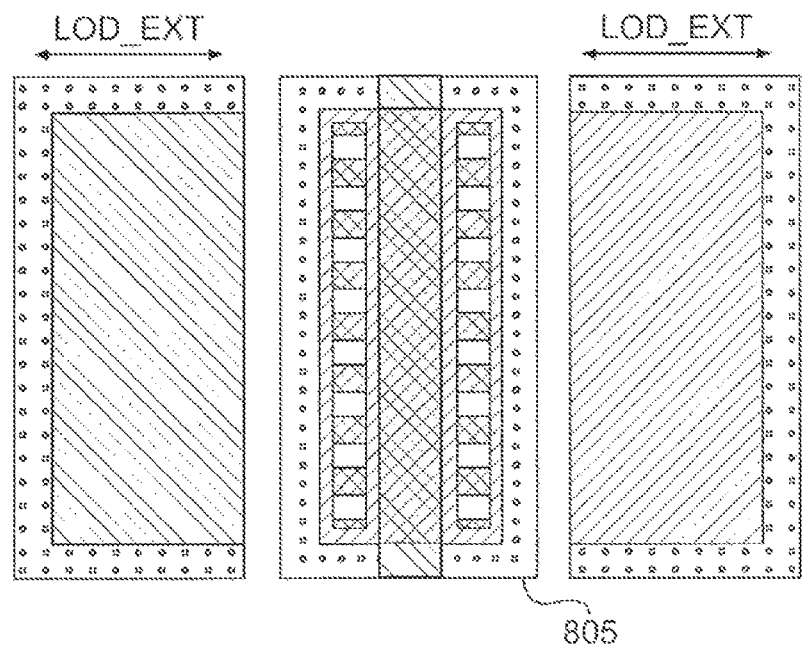
FIG. 8 is a diagram illustrating a left/right 00 extend capability associated with the exemplary circuit of FIG. 2 in accordance with an embodiment of the present invention.

In an embodiment of the present invention, a device (e.g., the exemplary differential pair of FIG. 2) is associated with a PCell and may be displayed with one or more of the following capabilities:

1. Parameter mapping (illustrated in FIG. 5A) where the "Scale" is optional;
2. Port mapping (illustrated in FIG. 6), which is optional;
3. Abutment (illustrated in FIG. 7 where elements 705 and 710 may be manipulated to abut each other, which results in element 715);
4. Left/right oxide diffusion (OD) extension with parameter control (illustrated in FIG. 8 where element 805 has an oxide diffusion that may be extended accordingly);
5. Min/max channel width/length; and
6. Boundary layer.

Figures 4, 5A:
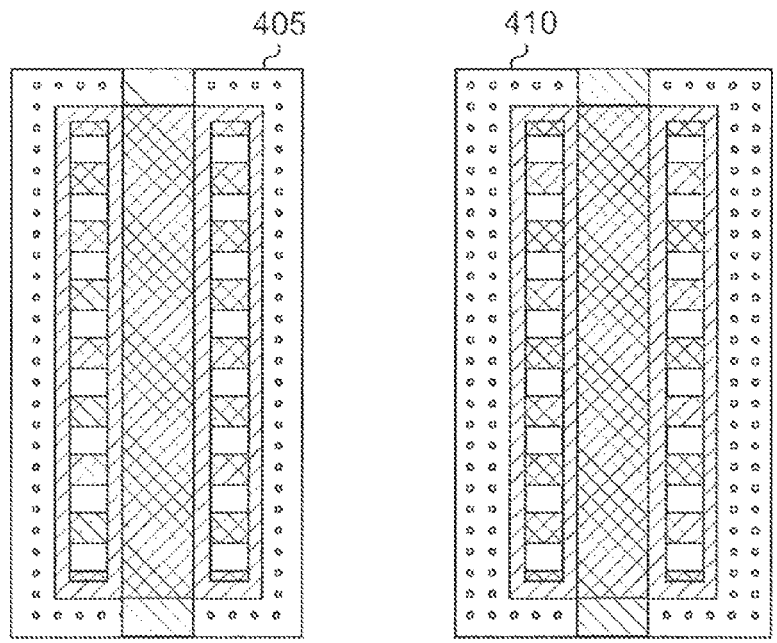
FIG. 4 is a layout of the exemplary circuit of FIG. 2.
FIG. 5A is a diagram illustrating a parameter mapping capability associated with the exemplary circuit of FIG. 2 in accordance with an embodiment of the present invention.

With reference to FIG. 5A, the parameters, each of which are a type of configurable attribute or parameter, in the exemplary illustrated mapping include the following:

W: total channel width of MOS device;
WF: finger number of MOS device;
L: channel length of MOS device;
NF: finger number of MOS device;
LOD_Ext: parameter that affects the left most OD width of MOS device; and
ROD Ext: parameter that affects the right most OD width of MOS Those skilled in the art will appreciate that other parameters may be included in such a mapping. For example, FIG. 5B illustrates another exemplary mapping of parameters, which includes similar parameters as shown in FIG. 5A but also includes an SD_Swap parameter (i.e., a parameter that swaps the logic information (net, port) on the source and drain pins).

The device can be displayed with such capabilities as one or more symbols in MDC, SDC, and symbol placement editor. One skilled in the art will appreciate that MDC/SDC 170 typically starts from a schematic design. That is, the user first designs a circuit (such as circuit 200) in a schematic editor, and then uses MDC/SDC 170 to implement the designed circuit in an exemplary layout. In one embodiment, MOS symbols representing such conventionally known circuit elements in the schematic are imported to MDC/SDC 170, from which the user may then manipulate the symbols in MDC/SDC 170 and generate a revised configuration of the exemplary layout.

However, in another embodiment, the user may start from an existing layout and convert the layout into one or more symbols, and then manipulate those symbols in a symbol-aware layout editor. For example, the user may start with an existing layout that includes PCell instances. Using the mapping file, those PCell instances may be represented as symbols. A layout editor that is capable of handling such symbols may be used to manipulate those PCell instances in a way similar to MDC/SDC 170. With the symbols being abstract views of an exemplary layout, editing in symbol mode saves the user from being cluttered with the increasing details of the actual full layout.

FIG. 9 is an exemplary listing representing the contents of an exemplary configuration file, which defines an appropriate parameter mapping scheme for the particular device related to the configuration file. As displayed, such as seen in the examples shown in the Figures associated with this description, these symbol mode editors can honor the particular device geometries and display the related symbol size for the device in the editor. In some embodiments, these mapping schemes are also bi-directional. As such, the particular device may be generated from the symbol editor to the layout or extracted from the layout to the symbol editor.

Figure 10:
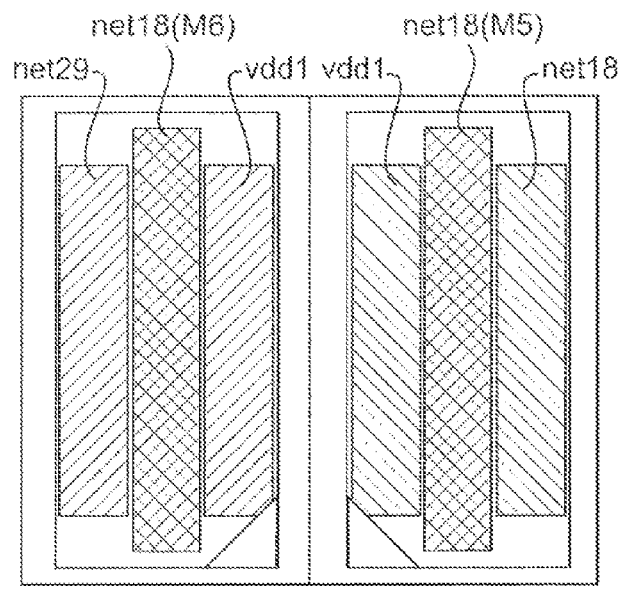
FIG. 10 is a diagram illustrating a result of PCell manipulation treatment of an exemplary device using parameter mapping and port mapping capabilities in accordance with an embodiment of the present invention.
Figure 11:
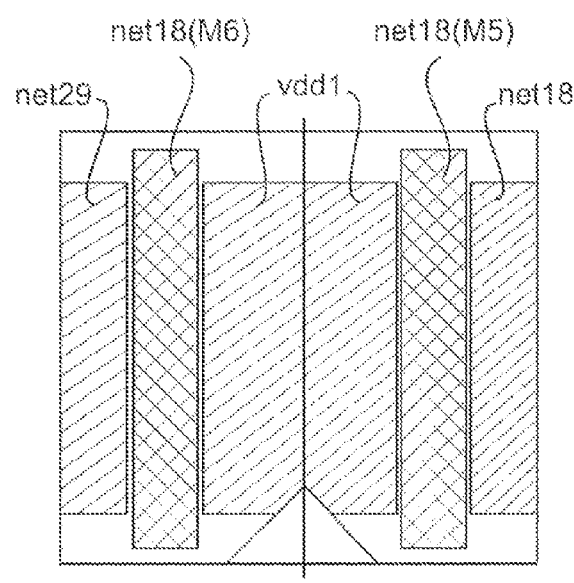
FIG. 11 is a diagram illustrating a result of PCell manipulation treatment of an exemplary device using parameter mapping, port mapping and abutment capabilities in accordance with an embodiment of the present invention.

In one embodiment using the above capabilities 1 & 2, an exemplary device can be treated as MOS in MDC, which is shown in FIG. 10. In another embodiment using the above capabilities 1, 2 & 3, an exemplary device can be treated as MOS in MDC with OD sharing as illustrated in the result diagram of FIG. 11 and in the layout diagram of FIG. 12.

Figure 12:
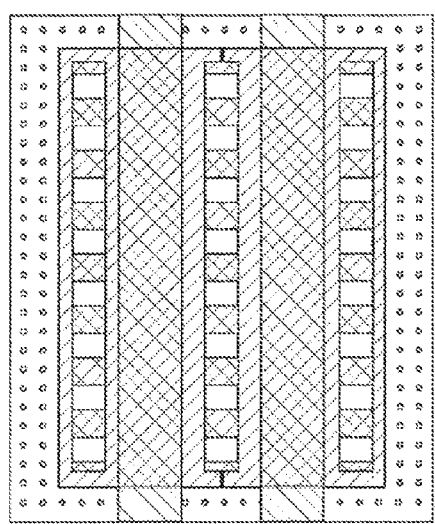
FIG. 12 is a layout of the result shown in FIG. 11 in accordance with an embodiment of the present invention.
Figure 13:
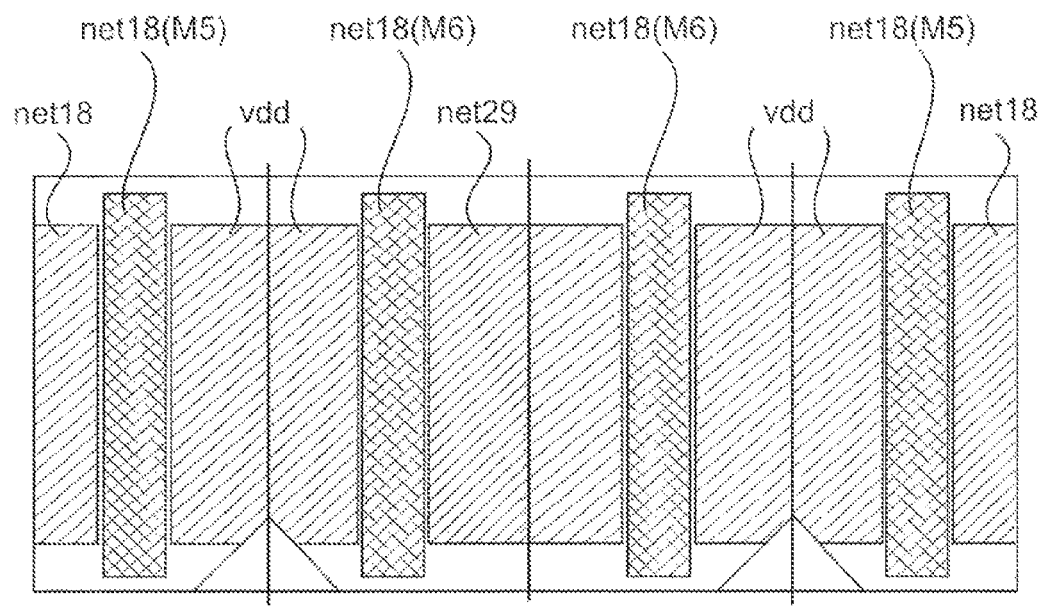
FIG. 13 is a diagram illustrating a result of PCell manipulation treatment of an exemplary device using an alternative finger number in accordance with an embodiment of the present invention.
Figure 14:
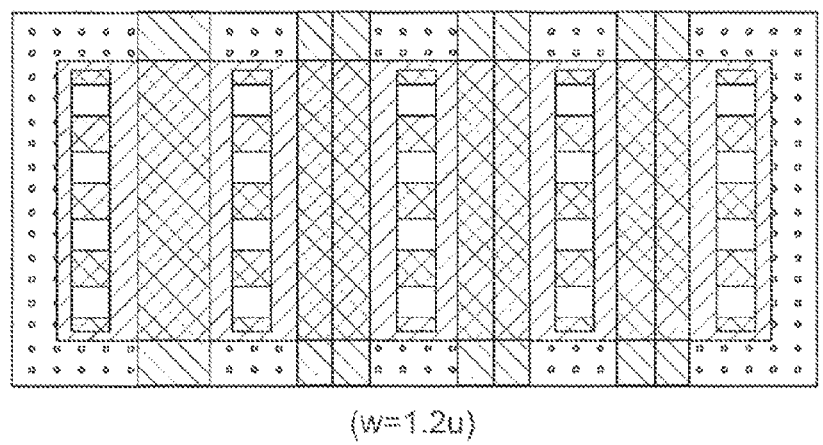
FIG. 14 is a layout of the result shown in FIG. 13 with an alternative channel width automatically calculated from the alternative finger number in FIG. 13 in accordance with an embodiment of the present invention.
Figure 15:
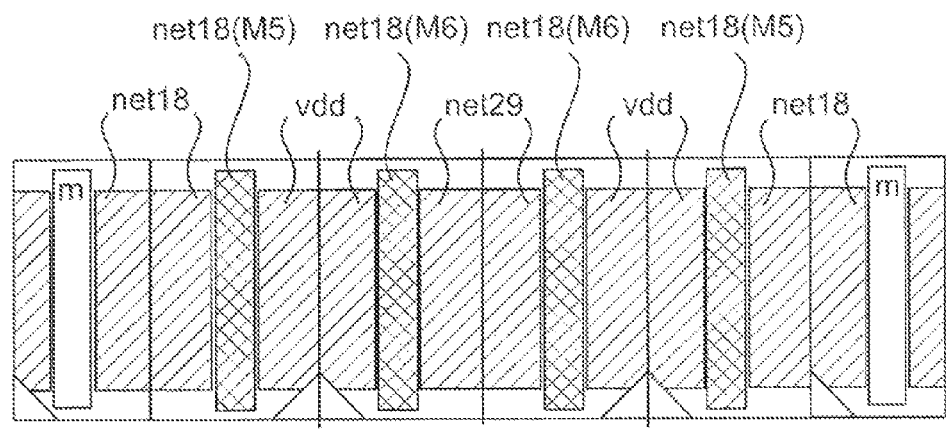
FIGS. 15 and 16 illustrate an example embodiment with a dummy device added having a customized channel width in accordance with an embodiment of the present invention.
Figure 16:
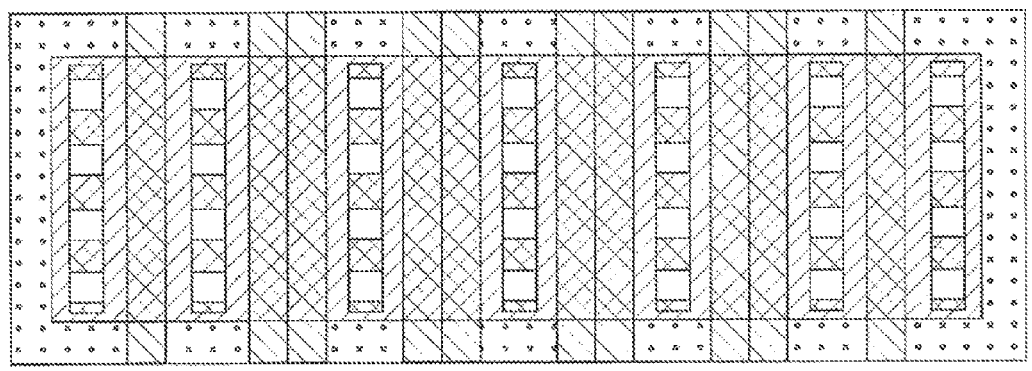

Using an embodiment of the present invention, a user may also edit the device in MDC to manipulate the PCell to an alternative number of device elements (which is commonly referred to as "number of fingers" and more generally referred to as a "number of devices".) For example, the PCell for the exemplary device shown in FIG. 11 may be manipulated from having a finger number of two to a finger number of four as shown in FIG. 13. Consequently, the channel width of the PCell alters automatically from 2.4 u as shown in FIG. 12 to 1.2 u as shown in FIG. 14. In an embodiment of the invention, such manipulation may be accomplished automatically when realizing or generating the resulting layout. If the finger number is large enough that the resulting channel width is smaller than the minimum channel width, the MDC module may block the layout realization in accordance with principles of the present invention. Additionally, as shown in embodiments illustrated in FIGS. 15 and 16, one or more dummy devices (shown as "voids!" structures) may be added to the PCell in MDC and the channel length of the dummy may be customized by the user. A minimum channel length may be defined in the related device information associated with the PCell for the device (e.g., in a configuration file or other mapping file).

Figure 17:
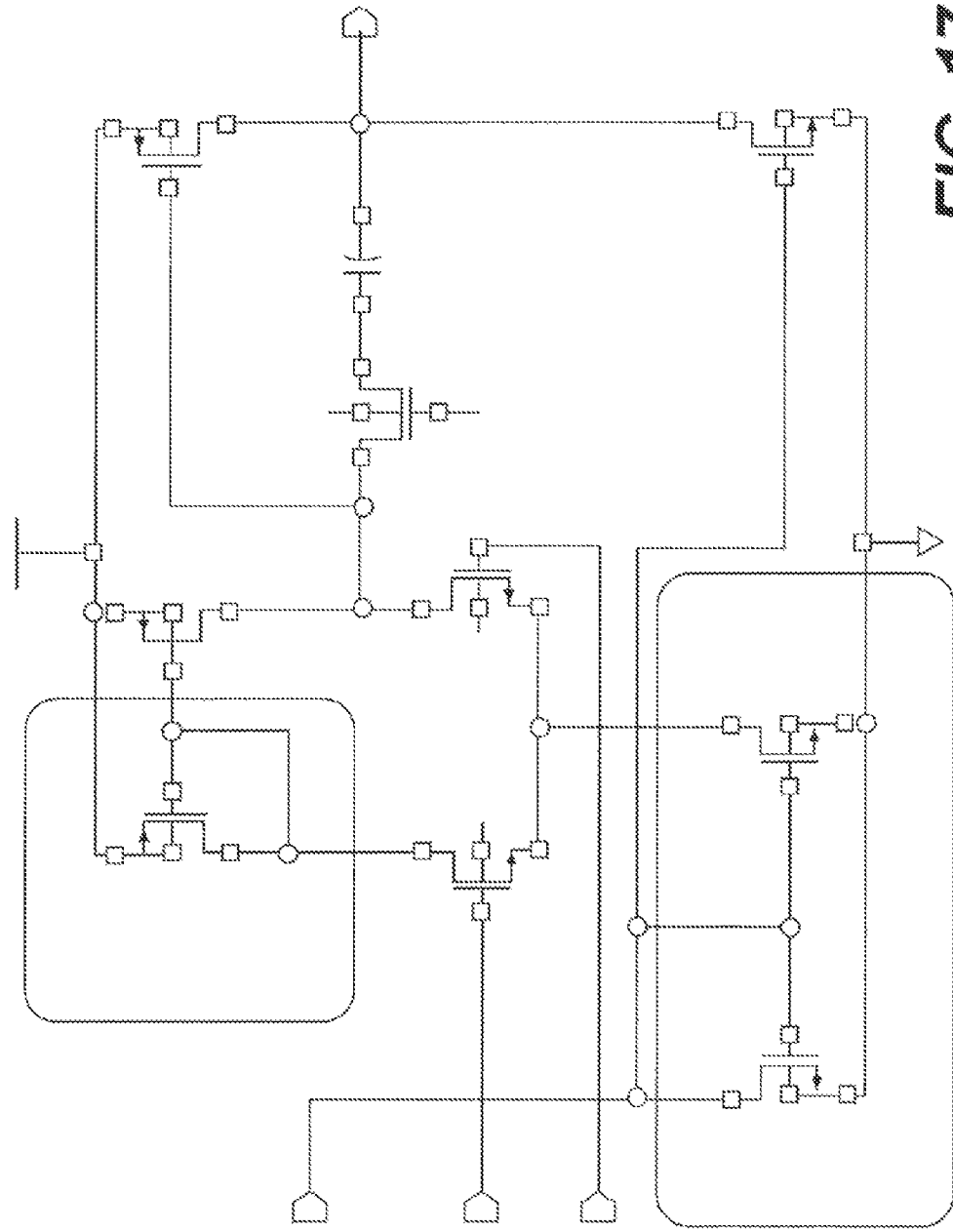
FIG. 17 is a schematic diagram of another exemplary circuit.
Figure 18:
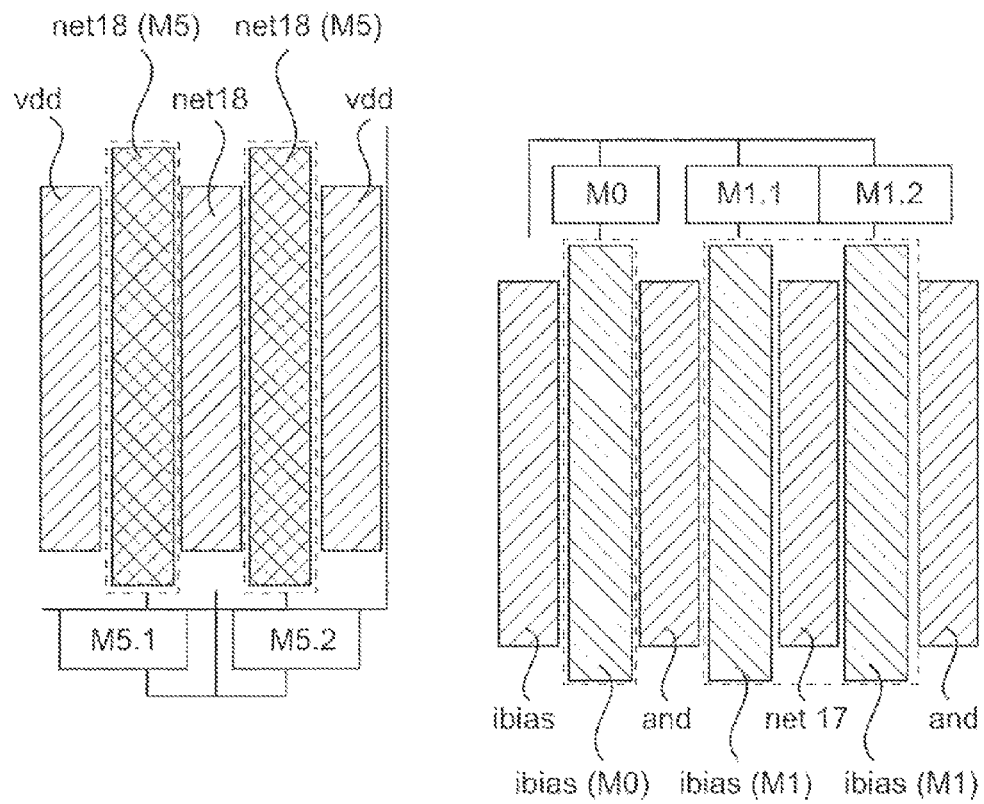
FIG. 18 is a diagramatic instance of exemplary PCells associated with the exemplary circuit of FIG. 17.
Figure 19:
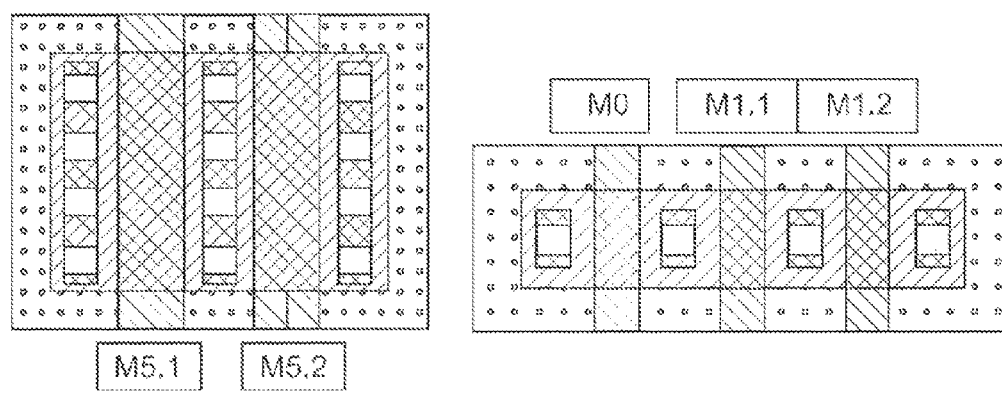
FIG. 19 is a layout of the exemplary circuit of FIG. 17.

The same editing scheme may be used in SDC. FIG. 17 illustrates an embodiment with another exemplary schematic circuit comprising various devices, such as devices (generally referred to as structures) M0/M1/M5 in the schematic of FIG. 17. FIG. 18 is a diagram of the symbol mode placement of these exemplary devices in the circuit of FIG. 17 and the realized layout model of these devices is shown in FIG. 19.

Figure 20:
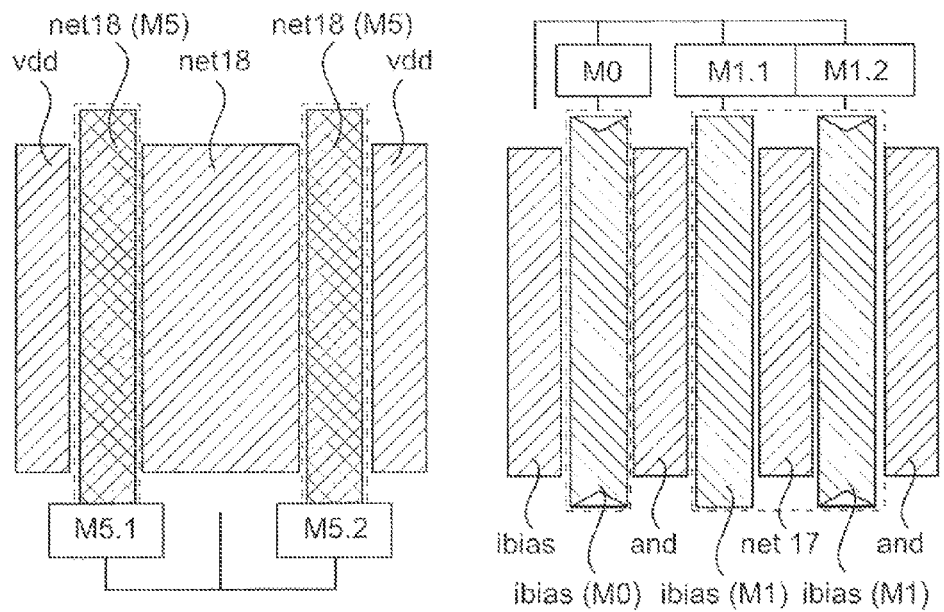
FIG. 20 is an exemplary diagram illustrating an alignment manipulation of select PCells associated with the exemplary circuit of FIG. 17.
Figure 21:
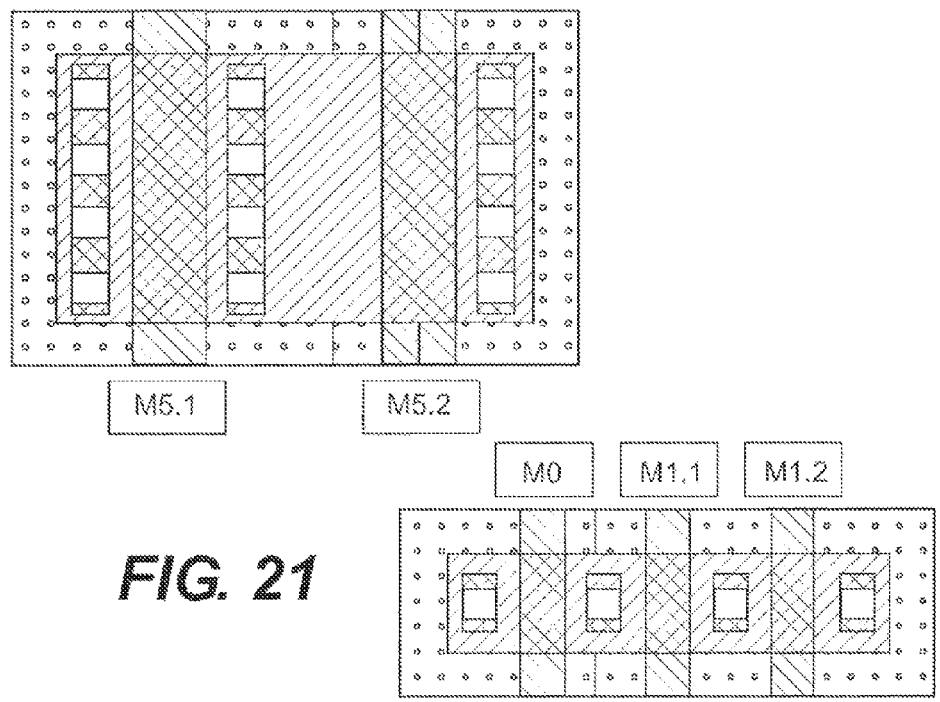
FIG. 21 is a layout of the result shown in FIG. 20 in accordance with an embodiment of the present invention.

In an embodiment shown in FIG. 20, the PCell may be manipulated by aligning M5.1 with M0 and M5.2 with M1.2. The realized layout of such a result is shown in FIG. 21. As indicated in a comparison of the exemplary layout results shown in FIGS. 19 and 21, the spacing between M5.1 and M5.2 is different. In more detail, an exemplary method of the present invention manipulates the alignment via adjustable capabilities of the related PCell. The exemplary method, implemented with executable code of the circuit design software that advantageously manipulates the PCell (via a transformation of PCell information representing the alternative exemplary circuit of FIG. 17) generally comprises the following steps:
1. Calculate the pitch of M0 and M1.2;
2. Calculate the pitch of M5.1 and M5.2;
3. Calculate the difference between the two pitches; and
4. Apply the difference to the ROD ext parameter to enlarge the right side OD extension of M5.1.

These manipulations transform the PCell data representing a physical circuit, which results in layout changes.

Figure 22:
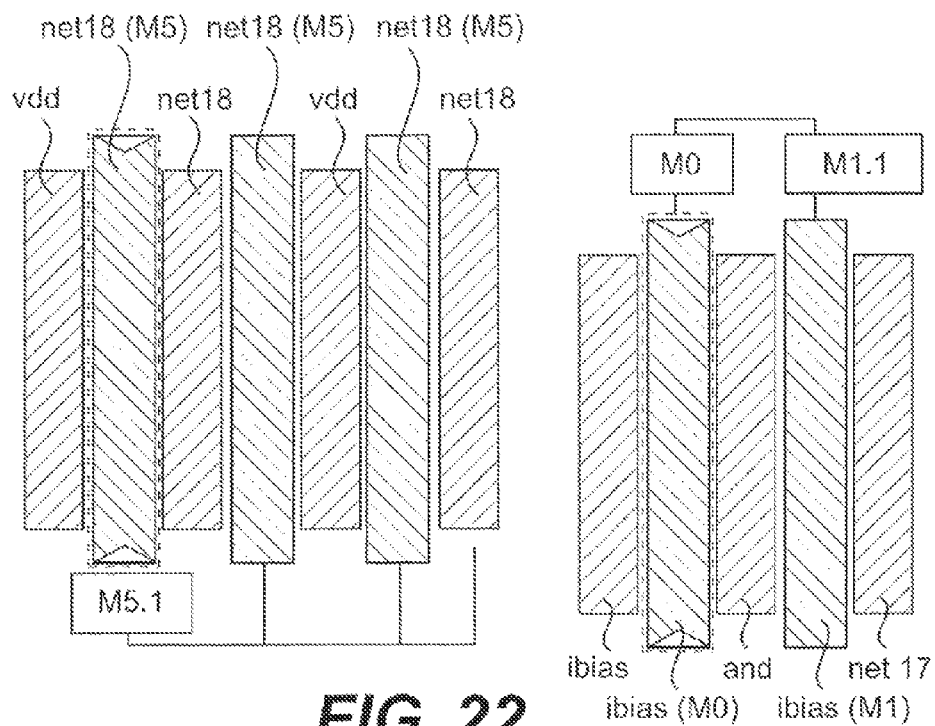
FIG. 22 is an exemplary diagram illustrating fold/merge manipulation of select PCells associated with the exemplary circuit of FIG. 17.
Figure 23:
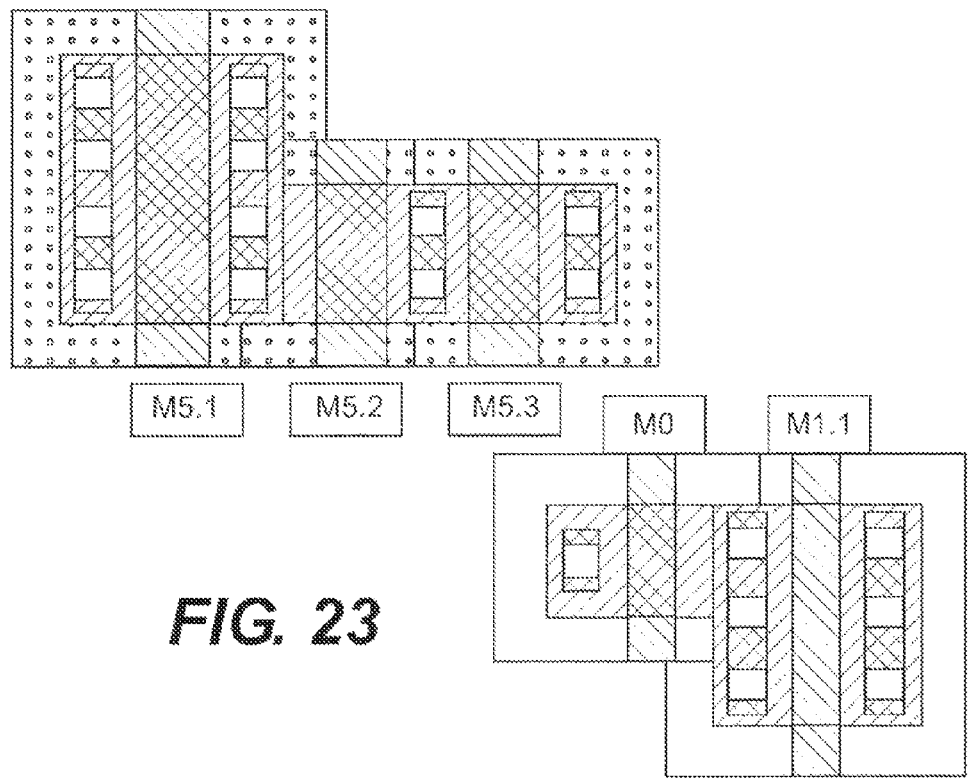
FIG. 23 is a layout of the result shown in FIG. 22 in accordance with an embodiment of the present invention.

In other embodiments of the present invention, the system provides the capability to "Fold" (increasing the number of fingers) or "Merge" (reducing the number of fingers) any device, such as a gate. To manipulate the "Fold" capability with regard to the M5.2 structure shown in FIG. 18, the result will be the M5.2.1 and M5.2.2 structures as shown in the embodiment illustrated in FIG. 22. In that embodiment, the channel width of M5.2.1 and M5.2.2 in FIG. 22 are half of the M5.2 structures shown in FIG. 18. In another embodiment, to manipulate the "Merge" capability with regard to the M1.1 and M1.2 structures shown in FIG. 18, the result will be the M1.1 structure in FIG. 22 where the channel width of M1.1 in FIG. 22 will be the sum of M1.1 and M1.2 in FIG. 18. The layout result in such an embodiment is illustrated in FIG. 23.

While the above described embodiments explain the principles of the present invention in terms of active structures of one or more devices (e.g., transistors), embodiments of the invention may also be applied to other types of devices, such as resistor devices and capacitor devices. For example, in an alternative embodiment, the mapping scheme may be substantially the same as those described above with mapping parameters such as "width", "length", "value", and the equations of resistor and capacitor value. Configuration files, such as the example illustrated in FIG. 9, may store such mapping parameters. Additionally, the editing commands in MDC for resistor and capacitor devices may be the same as with a MOS device. Resistor and capacitor device PCells may also support more advanced editing commands that provide the capability to arrange the different combinations of parallel and serial units to archive a better match pattern.

At least some portions of exemplary embodiments of the systems, apparatus and methods outlined above may used in association with portions of other exemplary embodiments. Moreover, at least some of the exemplary embodiments disclosed herein may be used independently from one another and/or in combination with one another and may have applications to devices and methods not disclosed herein. It will be apparent to those skilled in the art that various modifications and variations can be made to the structures and methodologies described herein. Thus, it should be understood that the invention is not limited to the subject matter discussed in the description. Rather, the present invention is intended to cover modifications and variations.

What is claimed is:

1. A computer-implemented method for generating a layout of a circuit, the method comprising:
   invoking the computer to receive a parameterized cell layout having a plurality of attributes;
   receiving data associated with an attribute of the parameterized cell layout via the computer;
   converting the parameterized cell layout, via the computer, to an associated symbolic cell layout in accordance with the received data, said symbolic cell layout being an abstract view of the parameterized cell layout;
   displaying the symbolic cell layout; and
   generating a second layout of the parameterized cell from the symbolic cell layout, said layout to be manufactured.

2. The computer-implemented method of claim 1, wherein the attribute is selected from a group consisting of a finger number parameter, a width parameter, a length parameter, a left most OD extension parameter, and a right most OD extension parameter.

3. The computer-implemented method of claim 1, wherein the data is associated with the abutment of the parameterized cell.

4. The computer-implemented method of claim 1, wherein the data causes a finger number parameter of the parameterized cell to change.

5. The computer-implemented method of claim 1, wherein the data causes a change in the alignment of the parameterized cell by determining a difference between a pitch of two elements associated with the parameterized cell and applying the difference to an extension parameter, wherein the generated second layout includes an adjusted aspect of one of the two elements.

6. The computer-implemented method of claim 1 wherein the data is associated with a width parameter of the parameterized cell.

7. The computer-implemented method of claim 1 wherein the data is associated with a channel width parameter of the parameterized cell.

8. The computer-implemented method of claim 1 wherein the data is associated with a length parameter of the parameterized cell.

9. The computer-implemented method of claim 1 wherein the data is associated with a left most OD extension parameter of the parameterized cell.

10. The computer-implemented method of claim 1 wherein the data is associated with a right most OD extension parameter of the parameterized cell.

11. The computer-implemented method of claim 1 wherein the data is associated with an alignment of the parameterized cell.

12. A computer system configured to generate a layout of an integrated circuit, the apparatus comprising:
   a processor;
   a video display;
   a non-transitory computer readable storage medium comprising instructions which when executed by the processor cause the processor to:
   invoke the computer system to receive a parameterized cell layout having a plurality of attributes;
   receive data associated with an attribute of the parameterized cell layout;
   convert the parameterized cell layout to an associated symbolic cell layout in accordance with the received data, said symbolic cell layout being an abstract view of the parameterized cell layout;
   display the symbolic cell layout; and
   generate a second layout of the parameterized cell from the associated symbolic cell layout, said layout to be manufactured.

13. The computer system of claim 12, wherein the instructions further cause the processor to select from a group consisting of a finger number parameter, a width parameter, a length parameter, a left most OD extension parameter, and right most OD extension parameter.

14. The computer system of claim 12, wherein the instructions further cause the processor to change a finger number parameter of the parameterized cell in accordance with the data.

15. The computer system of claim 12, wherein the instructions further cause the processor to determine a difference between a pitch of two elements associated with the parameterized cell in accordance with the data and apply the difference to an extension parameter, wherein the generated second layout adjusted aspect of one of the two elements.

16. The computer system of claim 12 wherein the data is associated with a width parameter of the parameterized cell.

17. The computer system of claim 12 wherein the data is associated with a channel width parameter of the parameterized cell.

18. The computer system of claim 12 wherein the data is associated with a length parameter of the parameterized cell.

19. The computer system of claim 12 wherein the data is associated with a left most OD extension parameter of the parameterized cell.

20. The computer system of claim 12 wherein the data is associated with a right most OD extension parameter of the parameterized cell.

21. The computer system of claim 12 wherein the data is associated with an alignment of the parameterized cell.

* * * * *

UNITED STATES PATENT AND TRADEMARK OFFICE
CERTIFICATE OF CORRECTION

| | | |
|---|---|---|
| PATENT NO. | : 9,852,251 B2 | Page 1 of 1 |
| APPLICATION NO. | : 14/203300 | |
| DATED | : December 26, 2017 | |
| INVENTOR(S) | : Hsiao-Tzu Lu et al. | |

It is certified that error appears in the above-identified patent and that said Letters Patent is hereby corrected as shown below:

On the Title Page

"(71) Applicants: Synopsys, Inc., Mountain View, CA
(US); Synopsys Taiwan Co., Ltd.,
Taipei (TW)"
Should read:
--(71) Applicant: Synopsys, Inc., Mountain View, CA
(US)--

"Related U.S. Application Data
(63) Continuation of application No. 13/514,068, filed on Jun. 6, 2011, now Pat. No 8,707,226."
Should read:
--Related U.S. Application Data
(63) Continuation of application No. 13/154,068, filed on Jun. 6, 2011, now Pat. No 8,707,226.--

Signed and Sealed this
Eighth Day of May, 2018

Andrei Iancu
*Director of the United States Patent and Trademark Office*